United States Patent
Han

(10) Patent No.: US 10,192,948 B2
(45) Date of Patent: Jan. 29, 2019

(54) AMOLED DISPLAY DEVICE AND ARRAY SUBSTRATE THEREOF

(71) Applicant: Shenzhen China Star Optoelectronics Technology Co., Ltd., Shenzhen, Guangdong (CN)

(72) Inventor: Baixiang Han, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 9 days.

(21) Appl. No.: 15/500,162

(22) PCT Filed: Jan. 19, 2017

(86) PCT No.: PCT/CN2017/071628
§ 371 (c)(1),
(2) Date: Jan. 30, 2017

(87) PCT Pub. No.: WO2018/040492
PCT Pub. Date: Mar. 8, 2018

(65) Prior Publication Data
US 2018/0219057 A1    Aug. 2, 2018

(30) Foreign Application Priority Data
Aug. 31, 2016  (CN) .......................... 2016 1 0794566

(51) Int. Cl.
H01L 27/32 (2006.01)

(52) U.S. Cl.
CPC .......... *H01L 27/3276* (2013.01); *H01L 27/32* (2013.01); *H01L 27/3241* (2013.01);
(Continued)

(58) Field of Classification Search
None
See application file for complete search history.

(56) References Cited

U.S. PATENT DOCUMENTS

| 7,663,306 B2* | 2/2010 | Imamura | H01L 27/3279 313/489 |
| 8,497,514 B2* | 7/2013 | Park | H01L 27/3244 257/40 |

(Continued)

FOREIGN PATENT DOCUMENTS

| CN | 1822738 | 8/2006 |
| CN | 101431093 | 5/2009 |

(Continued)

OTHER PUBLICATIONS

Search Report and Written Opinion, dated May 27, 2017, for International Application No. PCT/CN2017/071628.
(Continued)

*Primary Examiner* — Minh-Loan Tran

(57) ABSTRACT

An AMOLED display device and an array substrate thereof are disclosed. The array substrate of the AMOLED display device includes a baseplate, a surface-shaped power line, a point-shaped power line, and a plurality of insulating layers arranged between the surface-shaped power line and the point-shaped power line. The surface-shaped power line and the point-shaped power line are configured to provide a positive polarity power source to a light-emitting diode. The surface-shaped power line is formed on the baseplate, and the point-shaped power line is formed on the plurality of insulating layers. The surface-shaped power line and the point-shaped power line are electrically connected to each other through a via hole.

16 Claims, 3 Drawing Sheets

(52) U.S. Cl.
CPC ...... *H01L 27/3248* (2013.01); *H01L 27/3251* (2013.01); *H01L 27/3258* (2013.01); *H01L 27/3262* (2013.01)

(56) References Cited

U.S. PATENT DOCUMENTS

| | | | |
|---|---|---|---|
| 9,356,088 B2* | 5/2016 | Chen | G09G 3/3225 |
| 9,570,531 B2* | 2/2017 | Chung | H01L 27/3276 |
| 9,905,612 B2* | 2/2018 | Kwon | H01L 27/124 |
| 2012/0104420 A1* | 5/2012 | Lee | H01L 27/3276 |
| | | | 257/88 |
| 2015/0060809 A1* | 3/2015 | Kim | H01L 27/3246 |
| | | | 257/40 |
| 2015/0138146 A1* | 5/2015 | Hong | G06F 3/044 |
| | | | 345/174 |
| 2016/0099299 A1* | 4/2016 | Chung | H01L 27/3276 |
| | | | 257/40 |

FOREIGN PATENT DOCUMENTS

| | | |
|---|---|---|
| CN | 103745985 | 4/2014 |
| CN | 106206670 | 12/2016 |

OTHER PUBLICATIONS

Office Action and Search Report, dated Sep. 12, 2017, for Chinese Patent Application No. 201610794566.5.

\* cited by examiner

AMOLED DISPLAY DEVICE AND ARRAY SUBSTRATE THEREOF

CROSS REFERENCE TO RELATED APPLICATIONS

The present application claims the priority of Chinese patent application CN201610794566.5, entitled "AMOLED display device and array substrate thereof" and filed on Aug. 31, 2016, the entirety of which is incorporated herein by reference.

FIELD OF THE INVENTION

The present disclosure relates to the technical field of display, and particularly to an AMOLED display device and an array substrate thereof.

BACKGROUND OF THE INVENTION

With the development of display technologies, Active Matrix Organic Light-Emitting Diode (AMOLED) display technology gradually becomes mature and AMOLED display devices are increasingly used in different display fields.

A basic driving unit in an AMOLED display device is shown in FIG. 1. The driving unit comprises two thin-film transistors (TFT) and a storage capacitor Cst to form a 2T1C structure. A scanning signal Vgate is input to a gate of a first thin-film transistor, and a data signal Vdata is input to a source of the first thin-film transistor. A drain of the first thin-film transistor is connected to a gate of a second thin-film transistor. A source of the second thin-film transistor is connected to a positive polarity power source Vdd, and a drain thereof is connected to a digital ground Vss. The storage capacitor Cst is arranged between the gate of the second thin-film transistor and the source thereof. A light-emitting diode is connected in series between the drain of the second thin-film transistor and the digital ground Vss.

In order to transmit the positive polarity power source Vdd to each sub-pixel unit, a corresponding power line should be provided. As shown in FIG. 2, in an AMOLED display device in the prior art, a mesh-shaped power lines are provided on an array substrate. The power lines are arranged in two layers. That is, horizontal power lines 10 are directly formed on a baseplate of the array substrate, and vertical power lines 20 are formed on an insulating layer (not shown in FIG. 2). The insulating layer is arranged between the horizontal power lines 10 and the vertical power lines 20. However, the mesh-shaped power lines occupy an over large layout space, which will limit a quantity of sub-pixel units, and lead to a low Pixels Per Inch (PPI) of the AMOLED display device.

SUMMARY OF THE INVENTION

The present disclosure aims to provide an AMOLED display device and an array substrate thereof so as to improve PPI of the AMOLED display device.

The present disclosure provides an array substrate of an AMOLED display device. The array substrate comprises a baseplate, a surface-shaped power line, a point-shaped power line, and a plurality of insulating layers arranged between the surface-shaped power line and the point-shaped power line, wherein the surface-shaped power line and the point-shaped power line are configured to provide a positive polarity power source to a light-emitting diode; and wherein the surface-shaped power line is formed on the baseplate, the point-shaped power line is formed on the plurality of insulating layers, and the surface-shaped power line and the point-shaped power line are electrically connected to each other through a via hole.

The array substrate further comprises a metal lead wire formed on an edge area thereof, wherein the metal lead wire is used for leading a power source signal to the surface-shaped power line.

According to one embodiment, the metal lead wire and the surface-shaped power line are arranged in a same layer, and are formed as an integrated structure.

According to another embodiment, the metal lead wire and the point-shaped power line are arranged in a same layer, and the metal lead wire and the surface-shaped power line are electrically connected to each other through a via hole.

The array substrate further comprises a TFT corresponding to each sub-pixel unit, wherein the TFT comprises a gate, a source, a drain, and an active layer.

According to one embodiment, the plurality of insulating layers comprise a first insulating layer, a second insulating layer, and a third insulating layer that are formed from bottom to top in sequence. The gate is formed between the first insulating layer and the second insulating layer, and the active layer is formed between the second insulating layer and the third insulating layer.

According to another embodiment, the plurality of insulating layers comprise a first insulating layer, a second insulating layer, and a third insulating layer that are formed from bottom to top in sequence. The gate is formed between the second insulating layer and the third insulating layer, and the active layer is formed between the first insulating layer and the second insulating layer.

Preferably, the source and the drain are arranged in a same layer as the point-shaped power line.

Further, the source and the drain are connected to the active layer through a via hole.

The present disclosure further provides an AMOLED display device, which comprises the aforesaid array substrate.

The following beneficial effects can be brought about by the present disclosure. The array substrate of the AMOLED display device provided herein comprises the surface-shaped power line and the point-shaped power line that are configured to provide the positive polarity power source to the light-emitting diode. The surface-shaped power line is formed on the baseplate; the plurality of insulating layers are formed on the surface-shaped power line; and the point-shaped power line is formed on the insulating layers. The surface-shaped power line and the point-shaped power line are electrically connected to each other through a via hole so as to realize transmission of the positive polarity power source.

In the array substrate provided herein, the power line in a bottom layer is arranged as the surface-shaped power line, and the power line in a top layer is arranged as the point-shaped power line. That is, an occupying space of the power line in the top layer can be reduced. Therefore, more sub-pixel units can be arranged in a limited space in a denser manner, and PPI of the AMOLED display device can be improved.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The drawings necessary for explaining the embodiments are introduced briefly below to illustrate the technical solutions of the embodiments of the present disclosure more clearly. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Embodiment 1

Figure 1:
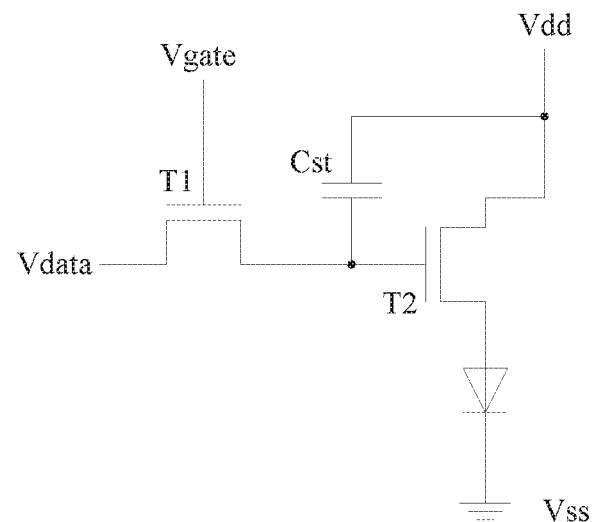
FIG. 1 is a circuit diagram of a driving unit of an AMOLED display device.
Figure 2:
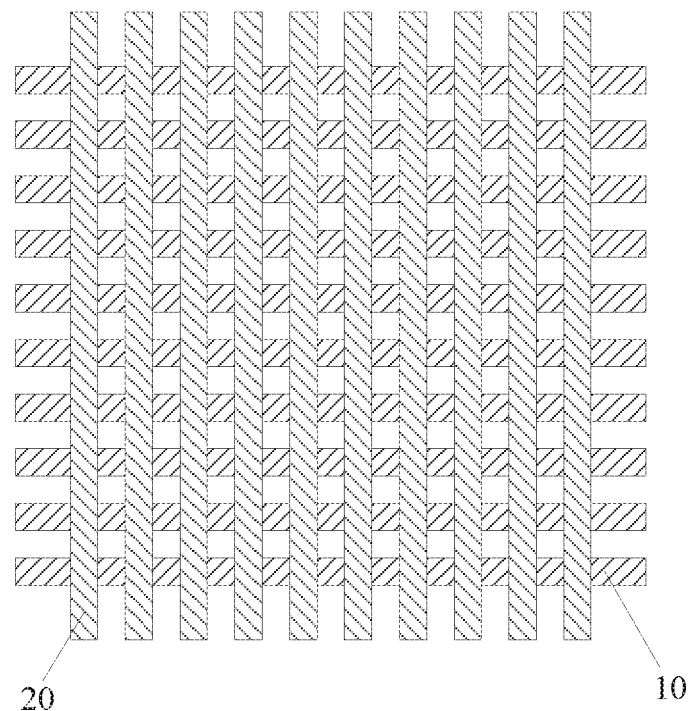
FIG. 2 schematically shows positive polarity power lines of an AMOLED display device in the prior art.
Figure 3:
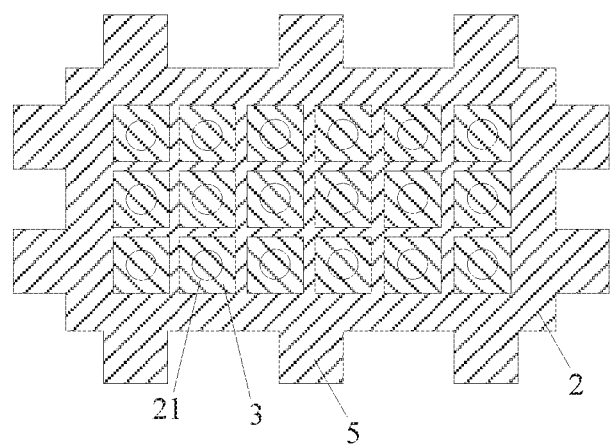
FIG. 3 is a plan view of an array substrate provided by embodiment 1 of the present disclosure.
Figure 4:
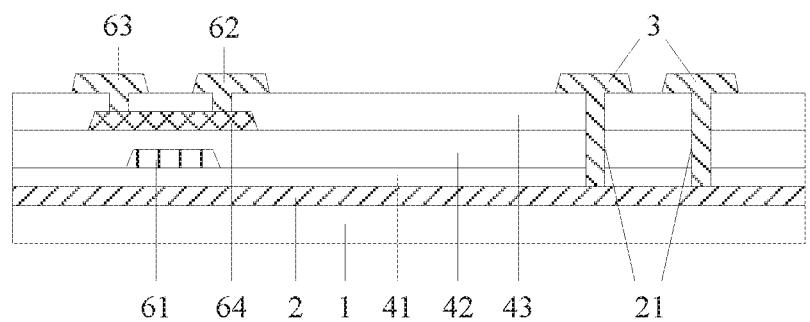
FIG. 4 is a sectional view of the array substrate provided by embodiment 1 of the present disclosure.

As shown in FIGS. 3 and 4, an array substrate of an AMOLED display device provided by the present embodiment comprises a baseplate 1, a surface-shaped power line 2, a point-shaped power line 3, and a plurality of insulating layers arranged between the surface-shaped power line 2 and the point-shaped power line 3. According to the present embodiment, the plurality of insulating layers comprise a first insulating layer 41, a second insulating layer 42, and a third insulating layer 43 that are formed from bottom to top in sequence.

The surface-shaped power line 2 and the point-shaped power line 3 are configured to provide a positive polarity power source to a light-emitting diode. The surface-shaped power line 2 is formed on the baseplate 1, and the point-shaped power line 3 is formed on the plurality of insulating layers. The surface-shaped power line 2 and the point-shaped power line 3 are electrically connected to each other through a via hole 21.

Further, according to the present embodiment, the array substrate further comprises a metal lead wire 5 formed on an edge area thereof, wherein the metal lead wire 5 is used for leading a power source signal to the surface-shaped power line 2. According to the present embodiment, the metal lead wire 5 and the surface-shaped power line 2 are arranged in a same layer, and are formed as an integrated structure.

According to the present embodiment, the array substrate further comprises a TFT corresponding to each sub-pixel unit, wherein the TFT comprises a gate 61, a source 62, a drain 63, and an active layer 64. According to the present embodiment, the TFT has a bottom gate structure, i.e., the gate 61 is arranged below the active layer 64.

Specifically, the gate 61 is formed between the first insulating layer 41 and the second insulating layer 42, and the active layer 64 is formed between the second insulating layer 42 and the third insulating layer 43. The source 62 and the drain 63 are arranged in a same layer as the point-shaped power line 3. The source 62 and the drain 63 are connected to the active layer 64 through a via hole. When the gate 61 receives a gate driving signal, the source 62 and the drain 63 are electrically connected to each other through the active layer 64.

The array substrate of the AMOLED display device provided in the present embodiment comprises the surface-shaped power line 2 and the point-shaped power line 3 that are configured to provide the positive polarity power source to the light-emitting diode. The surface-shaped power line 2 is formed on the baseplate 1; three insulating layers are formed on the surface-shaped power line 2; and the point-shaped power line 3 is formed on the insulating layers. The surface-shaped power line 2 and the point-shaped power line 3 are electrically connected to each other through a via hole so as to realize transmission of the positive polarity power source.

In the array substrate provided herein, the power line in a bottom layer is arranged as the surface-shaped power line 2, and the power line in a top layer is arranged as the point-shaped power line 3. That is, an occupying space of the power line in the top layer can be reduced. Therefore, more sub-pixel units can be arranged in a limited space in a denser manner, and PPI of the AMOLED display device can be improved.

Embodiment 2

Figure 5:
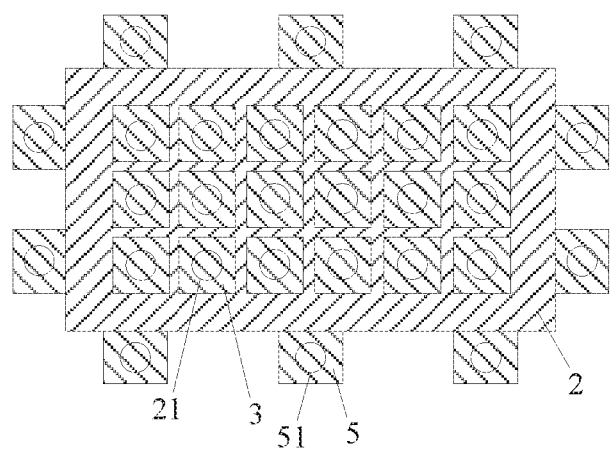
FIG. 5 is a plan view of an array substrate provided by embodiment 2 of the present disclosure.
Figure 6:
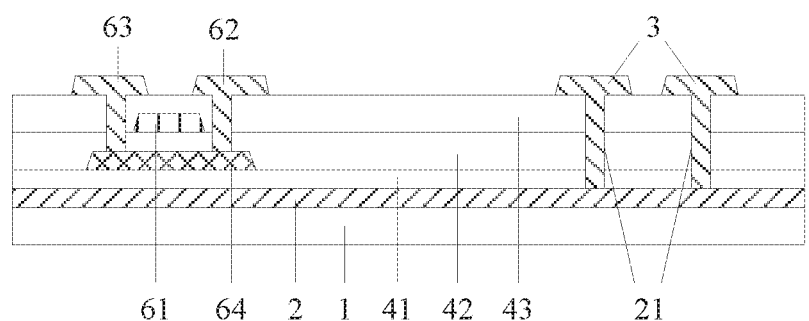
FIG. 6 is a sectional view of the array substrate provided by embodiment 2 of the present disclosure.

An array substrate of an AMOLED display device provided by the present embodiment is basically the same as that provided by embodiment 1, and the difference therebetween lies in that: as shown in FIGS. 5 and 6, according to the present embodiment, the metal lead wire 5 and the point-shaped power line 3 are arranged in a same layer, and the metal lead wire 5 and the surface-shaped power line 2 on a baseplate 1 are electrically connected to each other through a via hole.

Moreover, the array substrate of the present embodiment differs from that of embodiment 1 in that: as shown in FIG. 6, a TFT in the present embodiment has a top gate structure, i.e., a gate is arranged above an active layer.

Specifically, a gate 61 is formed between a second insulating layer 42 and a third insulating layer 43, and an active layer 64 is formed between a first insulating layer 41 and the second insulating layer 42. A source 62 and a drain 63 are arranged in a same layer as the point-shaped power line 3. The source 62 and the drain 63 are connected to the active layer 64 through a via hole. When the gate 61 receives a gate driving signal, the source 62 and the drain 63 are electrically connected to each other through the active layer 64.

The array substrate of the AMOLED display device provided in the present embodiment comprises the surface-shaped power line 2 and the point-shaped power line 3 that are configured to provide the positive polarity power source to the light-emitting diode. The surface-shaped power line 2 is formed on the baseplate 1; three insulating layers are formed on the surface-shaped power line 2; and the point-shaped power line 3 is formed on the insulating layers. The surface-shaped power line 2 and the point-shaped power line 3 are electrically connected to each other through a via hole so as to realize transmission of the positive polarity power source.

In the array substrate provided herein, the power line in a bottom layer is arranged as the surface-shaped power line 2, and the power line in a top layer is arranged as the point-shaped power line 3. That is, an occupying space of the power line in the top layer can be reduced. Therefore, more sub-pixel units can be arranged in a limited space in a denser manner, and PPI of the AMOLED display device can be improved.

Embodiment 3

The present embodiment provides an AMOLED display device, which comprises an array substrate provided by embodiment 1 or embodiment 2.

The AMOLED display device provided by the present embodiment and the array substrate provided by the above embodiments have same technical features, and thus they can solve same technical problem and achieve same technical effect.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. An array substrate of an AMOLED display device, comprising a baseplate, a surface-shaped power line, a point-shaped power line, and a plurality of insulating layers arranged between the surface-shaped power line and the point-shaped power line,
   wherein the surface-shaped power line and the point-shaped power line are configured to provide a positive polarity power source to a light-emitting diode; and
   wherein the surface-shaped power line is formed on the baseplate, the point-shaped power line is formed on the plurality of insulating layers, and the surface-shaped power line and the point-shaped power line are electrically connected to each other through a via hole;
   further comprising a metal lead wire formed on an edge area thereof, wherein the metal lead wire is used for leading a power source signal to the surface-shaped power line;
   wherein the metal lead wire and the point-shaped power line are arranged in a same layer, and the metal lead wire and the surface-shaped power line are electrically connected to each other through a via hole.

2. The array substrate according to claim 1, wherein the metal lead wire and the surface-shaped power line are arranged in a same layer, and are formed as an integrated structure.

3. The array substrate according to claim 1, further comprising a TFT corresponding to each sub-pixel unit, wherein the TFT comprises a gate, a source, a drain, and an active layer.

4. The array substrate according to claim 3, wherein the plurality of insulating layers comprise a first insulating layer, a second insulating layer, and a third insulating layer that are formed from bottom to top in sequence; and
   wherein the gate is formed between the first insulating layer and the second insulating layer, and the active layer is formed between the second insulating layer and the third insulating layer.

5. The array substrate according to claim 4, wherein the source and the drain are arranged in a same layer as the point-shaped power line.

6. The array substrate according to claim 5, wherein the source and the drain are connected to the active layer through a via hole.

7. The array substrate according to claim 3, wherein the plurality of insulating layers comprise a first insulating layer, a second insulating layer, and a third insulating layer that are formed from bottom to top in sequence; and
   wherein the gate is formed between the second insulating layer and the third insulating layer, and the active layer is formed between the first insulating layer and the second insulating layer.

8. The array substrate according to claim 7, wherein the source and the drain are arranged in a same layer as the point-shaped power line.

9. The array substrate according to claim 8, wherein the source and the drain are connected to the active layer through a via hole.

10. An AMOLED display device, comprising an array substrate, which comprises a baseplate, a surface-shaped power line, a point-shaped power line, and a plurality of insulating layers arranged between the surface-shaped power line and the point-shaped power line,
    wherein the surface-shaped power line and the point-shaped power line are configured to provide a positive polarity power source to a light-emitting diode; and
    wherein the surface-shaped power line is formed on the baseplate, the point-shaped power line is formed on the plurality of insulating layers, and the surface-shaped power line and the point-shaped power line are electrically connected to each other through a via hole;
    further comprising a metal lead wire formed on an edge area of the array substrate, wherein the metal lead wire is used for leading a power source signal to the surface-shaped power line;
    wherein the metal lead wire and the point-shaped power line are arranged in a same layer, and the metal lead wire and the surface-shaped power line are electrically connected to each other through a via hole.

11. The display device according to claim 10, wherein the metal lead wire and the surface-shaped power line are arranged in a same layer, and are formed as an integrated structure.

12. The display device according to claim 10, further comprising a TFT corresponding to each sub-pixel unit, wherein the TFT comprises a gate, a source, a drain, and an active layer.

13. The display device according to claim 12, wherein the plurality of insulating layers comprise a first insulating layer, a second insulating layer, and a third insulating layer that are formed from bottom to top in sequence; and
    wherein the gate is formed between the first insulating layer and the second insulating layer, and the active layer is formed between the second insulating layer and the third insulating layer.

14. The display device according to claim 13, wherein the source and the drain are arranged in a same layer as the point-shaped power line.

15. The display device according to claim 12, wherein the plurality of insulating layers comprise a first insulating layer, a second insulating layer, and a third insulating layer that are formed from bottom to top in sequence; and
  wherein the gate is formed between the second insulating layer and the third insulating layer, and the active layer is formed between the first insulating layer and the second insulating layer.

16. The display device according to claim 15, wherein the source and the drain are arranged in a same layer as the point-shaped power line.

* * * * *